(12) United States Patent
Yang et al.

(10) Patent No.: US 12,538,563 B2
(45) Date of Patent: Jan. 27, 2026

(54) TRENCH-TYPE POWER DEVICE AND MANUFACTURING METHOD THEREOF

(71) Applicant: Hangzhou Silicon-Magic Semiconductor Technology Co., Ltd., Zhejiang (CN)

(72) Inventors: Xiao Yang, Hangzhou (CN); Hui Chen, Hangzhou (CN); Jiakun Wang, Hangzhou (CN)

(73) Assignee: Hangzhou Silicon-Magic Semiconductor Technology Co., Ltd., Hangzhou (CN)

( * ) Notice: Subject to any disclaimer, the term of this patent is extended or adjusted under 35 U.S.C. 154(b) by 454 days.

(21) Appl. No.: 18/091,547

(22) Filed: Dec. 30, 2022

(65) Prior Publication Data

US 2023/0215943 A1 Jul. 6, 2023

(30) Foreign Application Priority Data

Dec. 30, 2021 (CN) .......................... 202111652594.0

(51) Int. Cl.
| | | |
|---|---|---|
| H10D 84/00 | (2025.01) | |
| H01L 21/04 | (2006.01) | |
| H01L 21/3205 | (2006.01) | |
| H01L 21/3213 | (2006.01) | |
| H01L 21/768 | (2006.01) | |
| H10D 8/01 | (2025.01) | |
| H10D 30/01 | (2025.01) | |
| H10D 30/66 | (2025.01) | |

(Continued)

(52) U.S. Cl.
CPC ......... *H10D 84/146* (2025.01); *H01L 21/046* (2013.01); *H01L 21/32051* (2013.01); *H01L 21/32133* (2013.01); *H01L 21/76877* (2013.01); *H10D 8/051* (2025.01); *H10D 30/023* (2025.01); *H10D 30/0291* (2025.01); *H10D 30/668* (2025.01); *H10D 62/154* (2025.01); *H10D 62/158* (2025.01); *H10D 62/235* (2025.01)

(58) Field of Classification Search
CPC .... H10D 84/146; H10D 8/051; H10D 12/031; H10D 62/8325
See application file for complete search history.

(56) References Cited

U.S. PATENT DOCUMENTS

| | | | | |
|---|---|---|---|---|
| 2006/0202264 A1* | 9/2006 | Bhalla | ................. | H10D 30/668 257/E29.066 |
| 2009/0305475 A1* | 12/2009 | Hshieh | ............... | H10D 30/0297 438/237 |
| 2018/0308975 A1* | 10/2018 | Ohse | ................... | H10D 30/668 |

FOREIGN PATENT DOCUMENTS

CN 113594043 A 11/2021

\* cited by examiner

*Primary Examiner* — Syed I Gheyas
(74) *Attorney, Agent, or Firm* — Westman, Champlin & Koehler, P.A.

(57) ABSTRACT

Disclosed is a trench-type power device and a manufacturing method thereof. The trench-type power device comprises: a semiconductor substrate; a drift region located on the semiconductor substrate; a first trench and a second trench located in the drift region; a gate stack located in the first trench; and Schottky metal located on a side wall of the second trench, wherein the Schottky metal and the drift region form a Schottky barrier diode. The trench-type power device adopts a double-trench structure, which combines a trench-type MOSFET with the Schottky barrier diode and forms the Schottky metal on the side wall of the trench, so that the performance of the power device can be improved, and the unit area of the power device can be reduced.

17 Claims, 5 Drawing Sheets

(51) Int. Cl.
*H10D 62/13* (2025.01)
*H10D 62/17* (2025.01)

- prior art -

TRENCH-TYPE POWER DEVICE AND MANUFACTURING METHOD THEREOF

CROSS-REFERENCE TO RELATED APPLICATIONS

The present application claims priority to Chinese Patent Application No. 202111652594.0, filed on Dec. 30, 2021, entitled by "TRENCH-TYPE POWER DEVICE AND MANUFACTURING METHOD THEREOF", and published as CN114512545A on May 17, 2022, which is incorporated herein by reference in its entirety.

FIELD OF TECHNOLOGY

The present disclosure relates to a technical field of semiconductor devices, and more particularly, to a trench-type power device and a manufacturing method thereof.

BACKGROUND

A power semiconductor device, also known as a power electronic device, comprises a power diode, a power transistor, a thyristor, etc. The power transistor comprises, for example, a VDMOS (vertical double-diffused metal oxide semiconductor) field effect transistor, a LDMOS (lateral diffused metal oxide semiconductor) field effect transistor and an IGBT (insulated gate bipolar transistor). On the basis of the VDMOS field effect transistor, a trench-type MOSFET is further proposed, wherein a gate conductor and a gate dielectric are formed in a trench, and in a conducting state, current mainly flows along a side wall of the trench.

In a circuit application scenario, a diode is connected in parallel between a source and a drain of the power transistor to improve the reverse recovery capability of the power transistor. FIG. 1 shows a schematic circuit diagram of a driving circuit for a three-phase brushless DC motor. The driving circuit comprises power transistors S11 to S13 and S21 to S23, diodes D11 to D13 and D21 to D23, and input capacitors. The power transistors S11 to S13 and S21 to S23 are connected into a full-bridge inverter circuit, and the diodes D11 to D13 and D21 to D23 are connected in parallel with the corresponding power transistors. For example, an anode and a cathode of the diode D11 are connected to a source and a drain of the power transistor S11, respectively. When the power transistor is turned off, the diode provides a feedback path from load current to a power supply, so that reverse bias voltage of the power transistor can be reduced and the reverse recovery capability can be improved.

It is desirable to integrate a reverse diode in the trench-type MOSFET to improve the reverse recovery capability.

SUMMARY

In view of the above problems, the purpose of the present application is to provide a trench-type power device and a manufacturing method thereof, wherein a double-trench structure is adopted, which combines a trench-type MOSFET with the Schottky barrier diode and forms the Schottky metal on the side wall of the trench, so as to improve the performance of the power device, and reduce the unit area of the power device.

According to a first aspect of the present disclosure, a trench-type power device is provided, and comprises: a semiconductor substrate; a drift region located on the semiconductor substrate; a first trench and a second trench located in the drift region; a gate stack located in the first trench; and Schottky metal located on a side wall of the second trench, wherein the Schottky metal and the drift region form a Schottky barrier diode.

In some embodiments, the trench-type power device further comprises: a well region located in the drift region; and a source region located in the well region, wherein the first trench and the second trench respectively penetrate through the source region and the well region and extend to a predetermined depth in the drift region.

In some embodiments, a dopant type of the semiconductor substrate, the drift region and the source region is N-type, a dopant type of the well region is P-type, and the semiconductor substrate serves as a drain region of a power transistor.

In some embodiments, the Schottky metal is located at a lower part of the side wall of the second trench and is in contact with the drift region, and a top end of the Schottky metal is located between the source region and the drift region.

In some embodiments, the trench-type power device further comprises a first contact layer located at an upper part of the side wall of the second trench and being in contact with the source region.

In some embodiments, the trench-type power device further comprises: a doped region of P type located below a bottom of the second trench; and a second contact layer located on a bottom surface of the second trench.

In some embodiments, the trench-type power device further comprises a conductive channel filled in the second trench for providing an electrical connection path between the source region and the Schottky metal.

According to a second aspect of the present disclosure, a manufacturing method of a trench-type power device is provided, and comprises: forming a drift region on a semiconductor substrate; forming a first trench and a second trench in the drift region; forming a gate stack in the first trench; and forming Schottky metal on a side wall of the second trench, wherein the Schottky metal and the drift region form a Schottky barrier diode.

In some embodiments, the manufacturing method further comprises: forming a well region in the drift region; and forming a source region in the well region, wherein the first trench and the second trench respectively penetrate through the source region and the well region and extend to a predetermined depth in the drift region.

In some embodiments, a dopant type of the semiconductor substrate, the drift region and the source region is N-type, a dopant type of the well region is P-type, and the semiconductor substrate serves as a drain region of a power transistor.

In some embodiments, the step of forming the Schottky metal comprises: forming a conformal first metal layer in the second trench; removing a portion, which is located at an upper part of the side wall of the second trench, of the first metal layer, and a portion, which is located at a bottom of the second trench, of the first metal layer, by performing anisotropic etching, wherein a portion, which remains at a lower part of the side wall of the second trench, of the first metal layer forms the Schottky metal.

In some embodiments, in the step of forming the Schottky metal, a top end of the Schottky metal is located between the source region and the drift region by controlling etching time of the anisotropic etching.

In some embodiments, after the step of forming the Schottky metal, the manufacturing method further comprises: forming a conformal second metal layer in the second trench; generating silicide by reaction of a portion of the second metal layer, by performing a silicidation process; and removing unreacted metal of the second metal layer relative to the Schottky metal and the silicide, by performing a selective etching process, wherein a portion, which is located at the upper part of the side wall of the second trench, of the silicide forms a first contact layer, and a portion, which is located at the bottom of the side wall of the second trench, of the silicide forms a second contact layer.

In some embodiments, after the step of forming the Schottky metal, the manufacturing method further comprises: filling a conductive material in the second trench to form a conductive channel for providing an electrical connection path between the source region and the Schottky metal.

In some embodiments, the manufacturing method further comprises forming a doped region of P type below the bottom of the second trench by performing ion implantation via the second trench.

According to the trench-type power device and the manufacturing method of the embodiment of the present disclosure, the double-trench structure is adopted, and gate conductor is located in the first trench and at least partially adjacent to a body region, so that an electric field is applied to the trench in the body region. The trench of the trench-type MOSFET is adjacent to the side wall of the first trench and vertically extends to form a vertical trench, so that the trench-type MOSFET has a smaller unit area, a lower specific on-resistance Rsp, and an improved voltage endurance capability. Further, Schottky metal is formed on the side wall of the second trench, so that a Schottky diode can be integrated with the minimum unit area cost to improve the reverse recovery capability of the power device.

In some embodiments, a heavily doped region of P type is formed below the bottom of the second trench. The doped region of P type is beneficial to alleviating the electric field concentration under the first trench, thereby improving the reliability of electric field control of the gate stack.

BRIEF DESCRIPTION OF THE DRAWINGS

The above and other objects, features and advantages of the present invention will become more apparent from the description below with reference to the accompanying drawings, in which.

DESCRIPTION OF THE EMBODIMENTS

Figure 1:
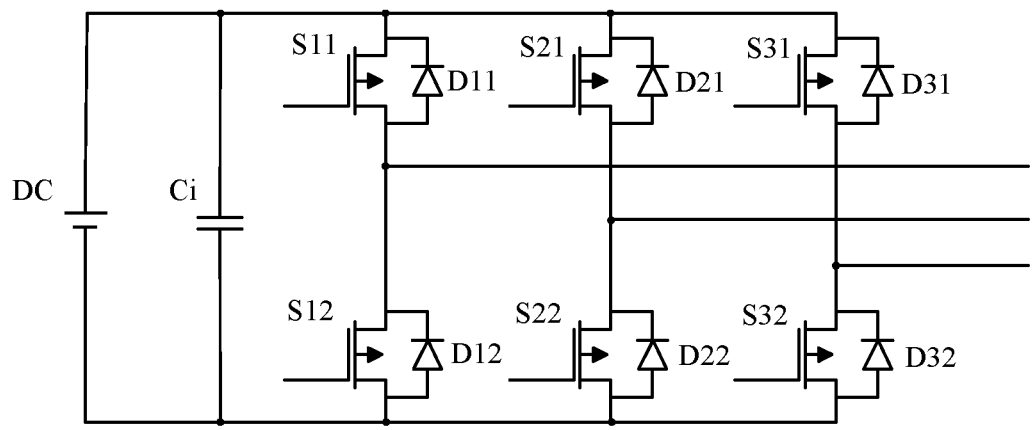
FIG. 1 shows a schematic circuit diagram of a driving circuit for a three-phase brushless DC motor.

The present invention will be described in more detail below with reference to the accompanying drawings. In the various figures, the same elements are denoted by the similar reference numerals. For the sake of clarity, the various parts in the figures are not drawn to scale. Additionally, some well-known parts may not be shown. For the sake of simplicity, a semiconductor structure obtained after several steps can be described in one figure.

It will be understood that in the description of device structures, when a layer or region is referred to as being "on" or "above" another layer or region, it can be directly on the other layer or region or there may be other layers or regions therebetween. And, if the device is turned over, this layer and region will be "below" or "under" another layer and region.

In order to describe a situation where a layer or region is directly on another layer or region, the expression "directly on . . . " or "on and adjacent to . . . " will be used herein.

The specific implementation of the disclosure will be further described in detail in combination with drawings and the embodiment.

Figure 2:
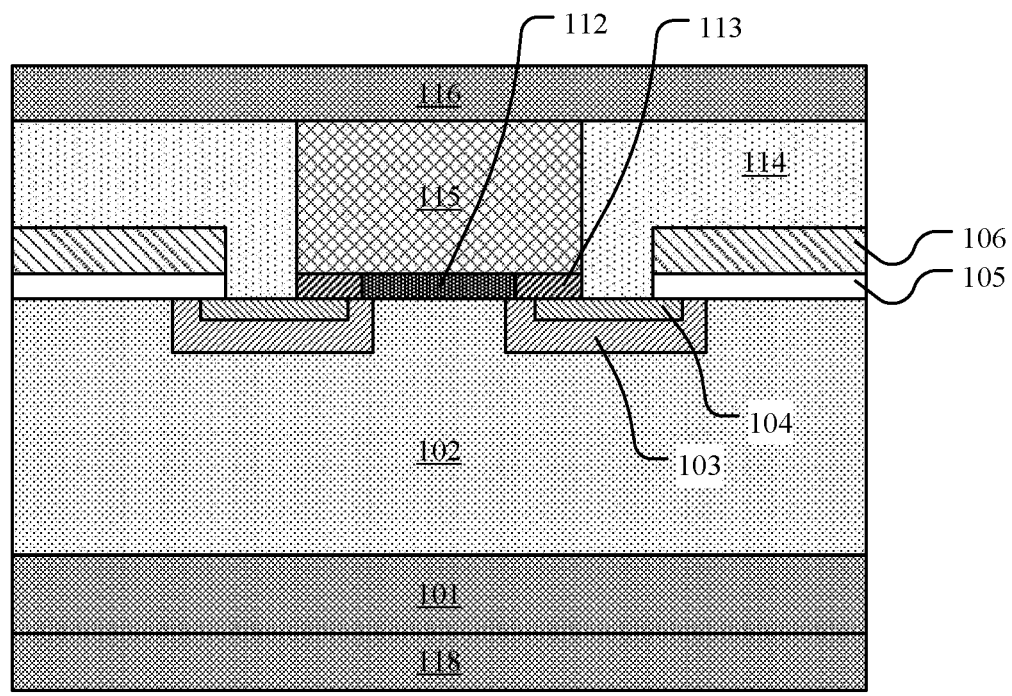
FIG. 2 shows a schematic cross-sectional view of a power device according to the prior art.

FIG. 2 shows a schematic cross-sectional view of a power device according to the prior art. The power device is integrated with a power transistor and a diode, wherein the diode is a Schottky Barrier diode (SBD).

The power device 100 comprises a semiconductor substrate 101, a drift region 102 located on the semiconductor substrate 101, a well region 103 located in the drift region 102, and a source region 104 located in the well region 103. The semiconductor substrate 101 also serves as a drain region of a MOSFET. A dopant type of the semiconductor substrate 101, the drift region 102 and the source region 104 is, for example, N-type, and the dopant type of the well region is, for example, P-type. The semiconductor substrate 101 is for example a heavily doped N-type silicon carbide substrate, and the drift region 102 is for example a lightly doped N-type epitaxial layer epitaxially grown on a surface of the semiconductor substrate 101. The well region 103 and the source region 104 are doped regions formed by performing ion implantation, for example.

An opening is formed in the well region 103, which exposes a surface of the drift region 102. For example, the well region 103 is split into two portions and an opening is formed between the two portions, or the well region 103 is in an integral shape and forms an opening surrounded by a closed portion. Anode metal 112 of the Schottky barrier diode is located above the opening so as to be in contact with the surface of the drift region 102 via the opening. The performance requirements of the Schottky barrier diode can be met by utilizing a contact area provided by the opening. A contact layer 113 is located on a surface of the source region 104 of the MOSFET and extends laterally to the anode metal 112 of the Schottky barrier diode, thereby connecting a source of the MOSFET with an anode of the Schottky barrier diode.

The gate stack comprises a gate dielectric 105 and a gate conductor 106 that are stacked. For example, a gate stack extends laterally from an edge of the source region 103 to the edge of a body region 104, and accordingly at least a portion of the gate conductor 106 is located above the body region 103 and is separated from the body region 103 by the gate dielectric 105, so that an electric field can be applied to a trench in the body region 103.

An interlayer dielectric layer 114 covers the source region and the gate stack of the power device, and is formed with a channel hole exposing Schottky anode metal. A conductive material is filled in the channel hole to form a conductive channel 115. Further, a source electrode 116 electrically connected to the conductive channel 115 is formed on the interlayer dielectric layer 114, and a drain electrode 118 is formed on a surface, opposite to the source region, of the semiconductor substrate 101.

The power device according to the above-mentioned prior art comprises a source electrode and a drain electrode formed on the opposite surfaces of the substrate; however, a planar gate structure is still adopted in the power device.

The inventor has noticed that compared with the power device with the planar gate structure, the trench-type MOSFET that adopts a trench gate structure can have smaller unit area, lower specific on-resistance Rsp, and improved voltage endurance capability. Therefore, the inventor further develops a trench-type MOSFET integrated with a Schottky barrier diode.

Figure 3:
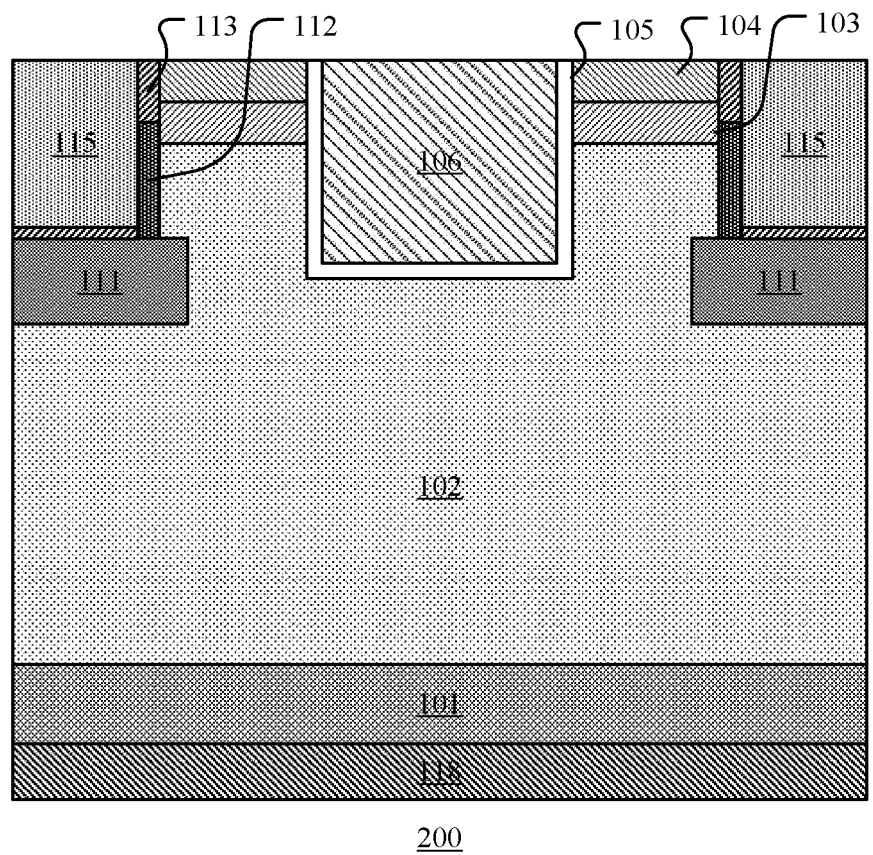
FIG. 3 shows a schematic cross-sectional view of a trench-type power device according to a first embodiment of the present disclosure.

FIG. 3 shows a schematic cross-sectional view of a trench-type power device according to a first embodiment of the present disclosure. The trench-type power device integrates a power transistor and a diode, wherein the diode is a Schottky Barrier diode (SBD).

The power device 200 comprises a semiconductor substrate 101, a drift region 102 located on the semiconductor substrate 101, a well region 103 located in the drift region 102, and a source region 104 located in the well region 103. The semiconductor substrate 101 also serves as a drain region of a MOSFET. A dopant type of the semiconductor substrate 101, the drift region 102 and the source region 104 is, for example, N-type, and the dopant type of the well region is, for example, P-type. The semiconductor substrate 101 is for example a heavily doped N-type silicon carbide substrate, and the drift region 102 is for example a lightly doped N-type epitaxial layer epitaxially grown on a surface of the semiconductor substrate 101. The well region 103 and the source region 104 are doped regions formed by performing ion implantation, for example.

The first trench and the second trench extend from the surface of the source region 104 into the drift region 102, respectively, and sequentially penetrate through the source region 104 and the well region 103.

A gate dielectric 105 is formed on a side wall and a bottom of the first trench, and a gate conductor 106 is filled inside the first trench. At least a portion of the gate conductor 106 is adjacent to the body region 103 and is separated from the body region 103 by the gate dielectric 105, so that an electric field can be applied to the trench in the body region 103.

Schottky metal 112 and a contact layer 113 are formed on the side wall of the second trench, and the conductive channel 115 is filled inside the second trench. The contact layer 113 is located at an upper part of the side wall and is in contact with an end of the source region 104. The Schottky metal 112 is located at a lower part of the side wall and is in contact with drift region 102. Preferably, the top end of the Schottky metal 112 is located between the source region 104 and the drift region 102, that is, located in well region 103. The contact layer 113 extends along the side wall of the second trench, thereby connecting the source of the MOSFET with the anode of the Schottky barrier diode. The performance requirements of the Schottky barrier diode can be met by utilizing the contact area provided by the side wall of the second trench.

Further, a drain electrode 118 is formed on the surface, opposite to the source region, of the semiconductor substrate 101. Although not shown, the trench-type MOSFET 200 may further comprise an interlayer dielectric layer and a source electrode located on the interlayer dielectric layer, and the source electrode is connected to the conductive channel 115 via a conductive channel in the interlayer dielectric layer, so that electrical connection between the source region 104 of the MOSFET and the anode metal 112 of the Schottky barrier diode is realized.

The trench-type power device according to present embodiment not only comprises the source electrode and the drain electrode formed on the opposite surfaces of the substrate, but also adopts a double-trench structure in which the gate conductor is located in the first trench and at least partially adjacent to the body region, so that an electric field is applied to the trench in the body region. The trench of the trench-type MOSFET is adjacent to the side wall of the first trench and vertically extends to form a vertical trench, so that the trench-type MOSFET has a smaller unit area, a lower specific on-resistance Rsp, and an improved voltage endurance capability. Further, Schottky metal is formed on the side wall of the second trench, so that a Schottky diode can be integrated with the minimum unit area cost to improve the reverse recovery capability of the power device.

In a preferred embodiment, a heavily doped region of P type 121 is formed below the bottom of the second trench, and a contact layer 122 is formed at the bottom of the second trench. The conductive channel 115 filled in the second trench is connected to the doped region 121 via the contact layer 122, connected to the source region 103 via the contact layer 113, and directly connected to the anode metal 112, respectively. The doped region 121 is beneficial to alleviating the electric field concentration under the first trench, thereby improving the reliability of electric field control of the gate stack.

FIGS. 4a to 4g show schematic cross-sectional views of different stages of a manufacturing method of a trench-type power device according to a second embodiment of the present disclosure.

The manufacturing method starts with the semiconductor substrate 101. The semiconductor substrate 101 used in the power transistor is, for example, a silicon substrate, a silicon carbide substrate, and a gallium nitride substrate. In the present embodiment, it is preferable to use a heavily doped N-type silicon carbide substrate since the wide bandgap characteristic of silicon carbide is conducive to reducing leakage current and power consumption, and the high breakdown field strength is conducive to improving the voltage endurance capability, increasing current density, and reducing the device size. Furthermore, the heavily doped N-type silicon carbide substrate can also serve as a drain region of the power device.

Figure 4A:
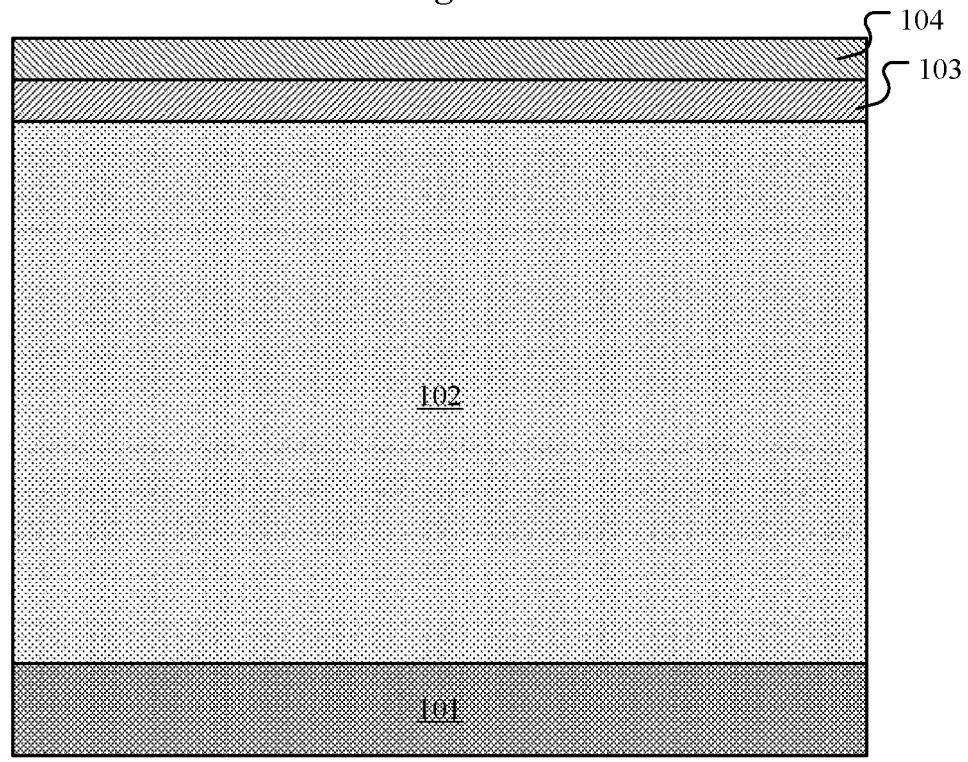
FIGS. 4a to 4g show schematic cross-sectional views of different stages of a manufacturing method of a trench-type power device according to a second embodiment of the present disclosure.

Referring to FIG. 4a, a drift region 102 is formed on a semiconductor substrate 101, and a well region 103 and a source region 104 are formed in the drift region 102.

In this step, an epitaxial layer is grown on the surface of the semiconductor substrate 101 by performing an epitaxial growth process, and the epitaxial layer is doped in situ during growth to form a lightly doped N-type epitaxial layer. In the present embodiment, a silicon carbide epitaxial layer is formed on a silicon carbide substrate by performing chemical vapor deposition, thereby forming a lightly doped N-type drift region 102 composed of silicon carbide.

Further, the well region 103 and the source region 104 are formed in the drift region 102 by performing an ion implantation process. The well region 103 and the source region 104 are a doped region of P type and a doped region of N type, respectively. The dopant used to form the P-type doped region is, for example, Al and/or B, and the dopant used to form the N-type doped region is, for example, N.

Figure 4B:
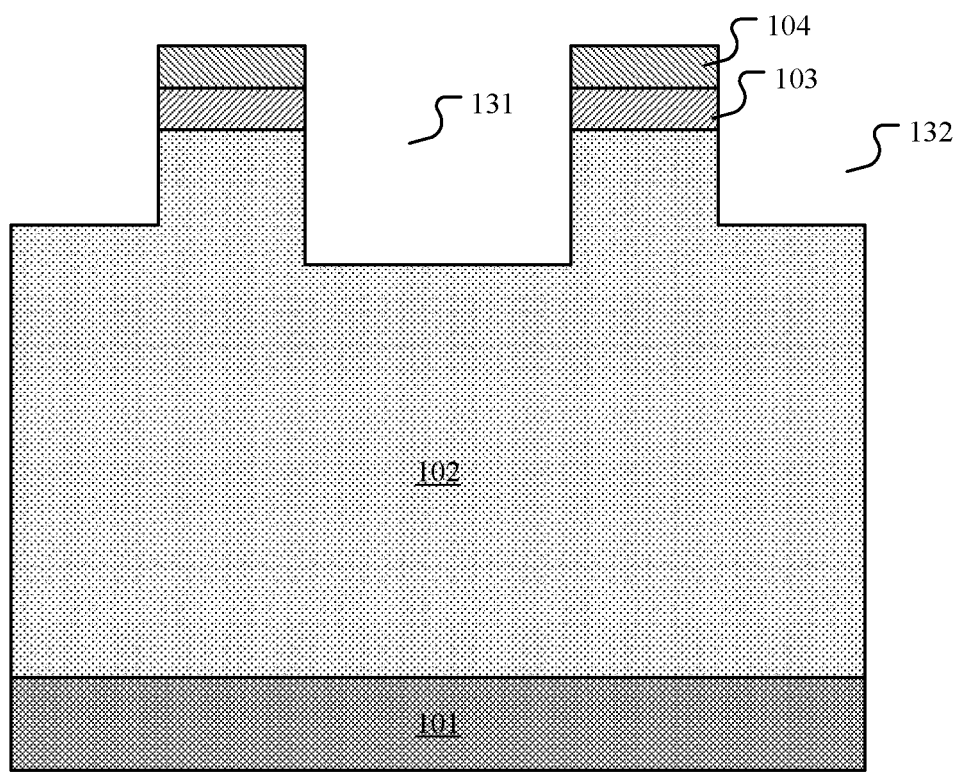

Referring to FIG. 4b, a first trench 131 and a second trench 132 extending from the surface of the source region 104 into the drift region 102 are formed.

In this step, a resist mask is formed on the surface of the source region 104, and a pattern is formed in the resist mask by performing a photolithographic process. By performing anisotropic dry etching, the source region 104, the well region 103 and the drift region 102 are sequentially etched via an opening in the pattern, thereby forming the first trench 131 and the second trench 132 penetrating through the source region 104 and the well region 103. By controlling the etching time, the first trench 131 and the second trench 132 can be controlled to reach a predetermined depth in the drift region 102.

After the etching process, the resist mask is removed by solvent dissolution or ashing.

Figure 4C:
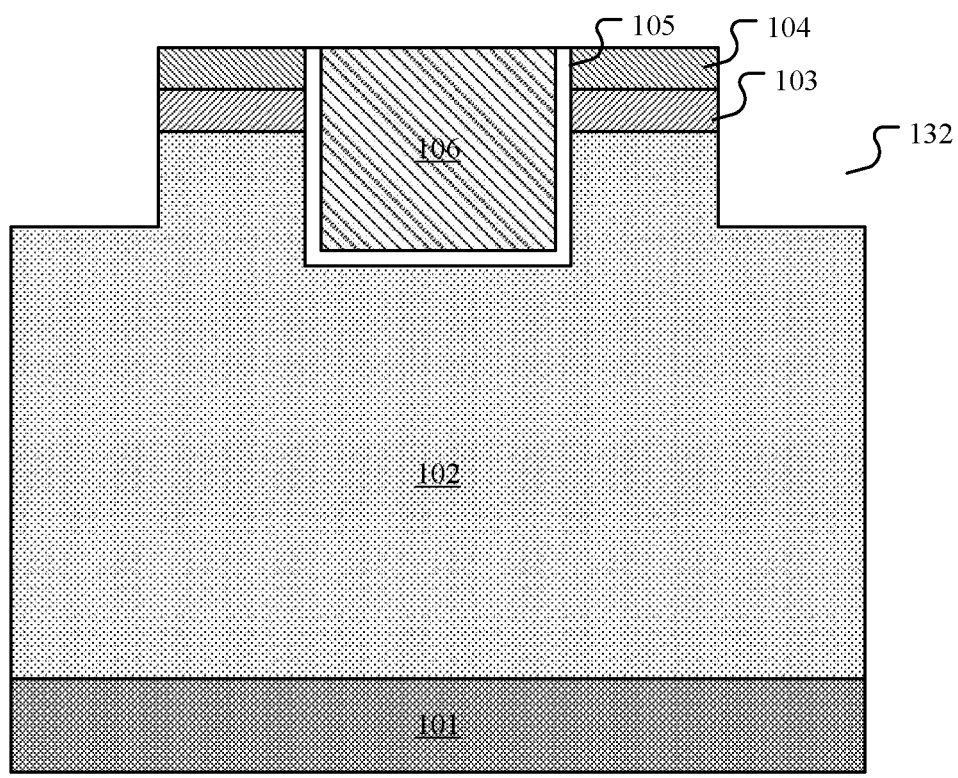

Referring to FIG. 4c, a gate dielectric 105 is formed on a side wall and a bottom of the first trench 131, and a gate conductor 106 is filled inside the first trench.

In this step, for example, silicon carbide is converted into silicon oxide by performing thermal oxidation to form the gate dielectric 105. Then, a conductive material is deposited to fill the first trench 131, and the conductive material outside the first trench 131 is removed by performing chemical mechanical planarization, so that the gate conductor 106 is formed.

Figure 4D:
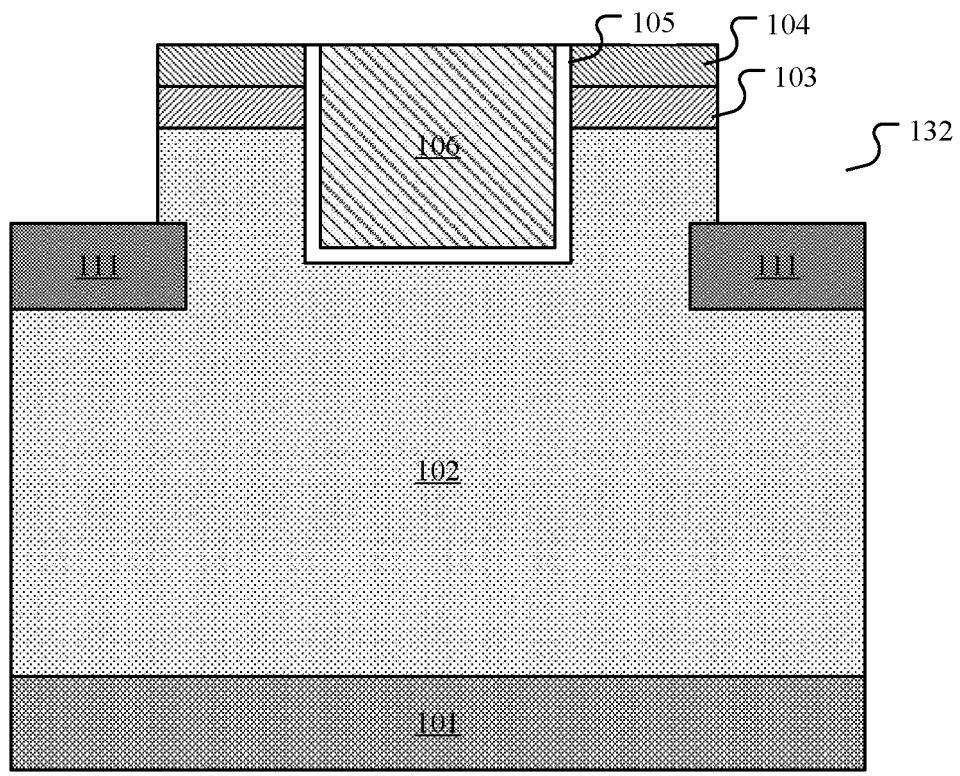

Referring to FIG. 4d, a doped region 121 is formed below the bottom of the second trench 132.

In this step, a resist mask is formed by performing the above-mentioned photolithographic process to shield the source region 104 and the gate stack and expose the second trench 132. Ion implantation is performed by performing the above-mentioned P-type dopant, and the dopant is implanted into the drift region 102 via the second trench 132 to form the heavily doped region of P type 132.

After the ion implantation process, the resist mask is removed by solvent dissolution or ashing.

Figure 4E:
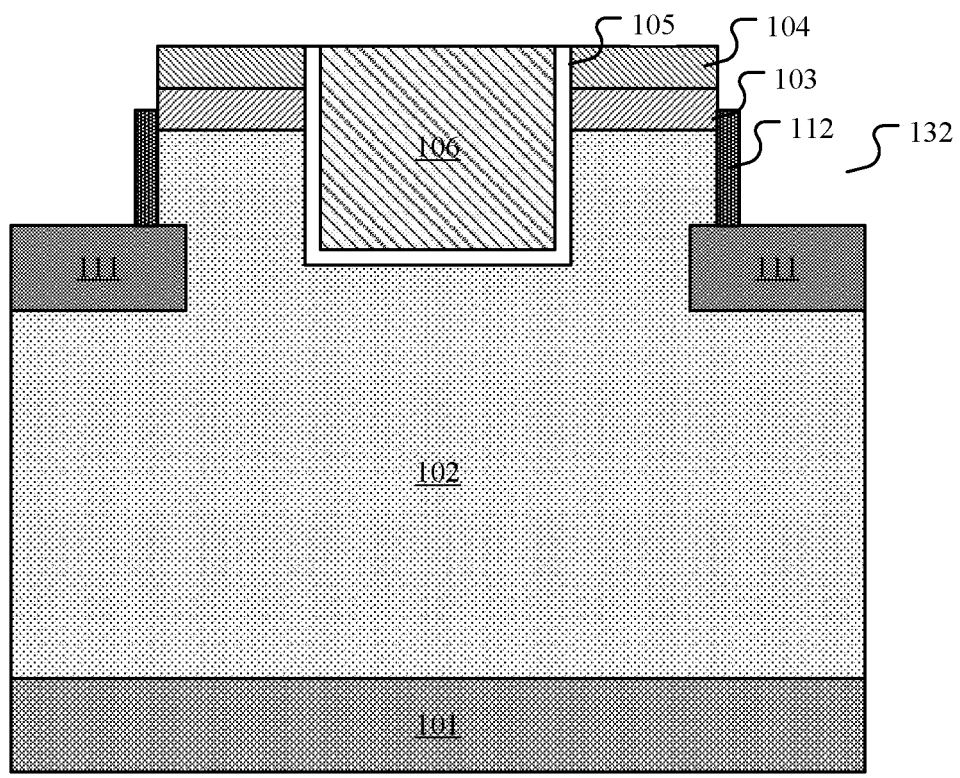

Referring to FIG. 4e, Schottky metal 112 is formed at the lower part of the side wall of the second trench 132.

In this step, a conformal metal layer is formed in the second trench 132 by performing chemical vapor deposition. Further, a portion, which is located on an upper part of the side wall of the second trench 132, of the metal layer, and a portion, which is located on a bottom surface of the second trench 132, of the metal layer are removed by performing the anisotropic etching process, so that the metal layer only remains on the lower part of the side wall of the second trench 132 to form the Schottky metal 112. By controlling the etching time, a top end position of the Schottky metal 112 can be controlled. In the present embodiment, the top end of the Schottky metal 112 is located between the source region 104 and the drift region 102. The metal layer used for the Schottky metal 112 is composed of titanium, for example.

Figure 4F:
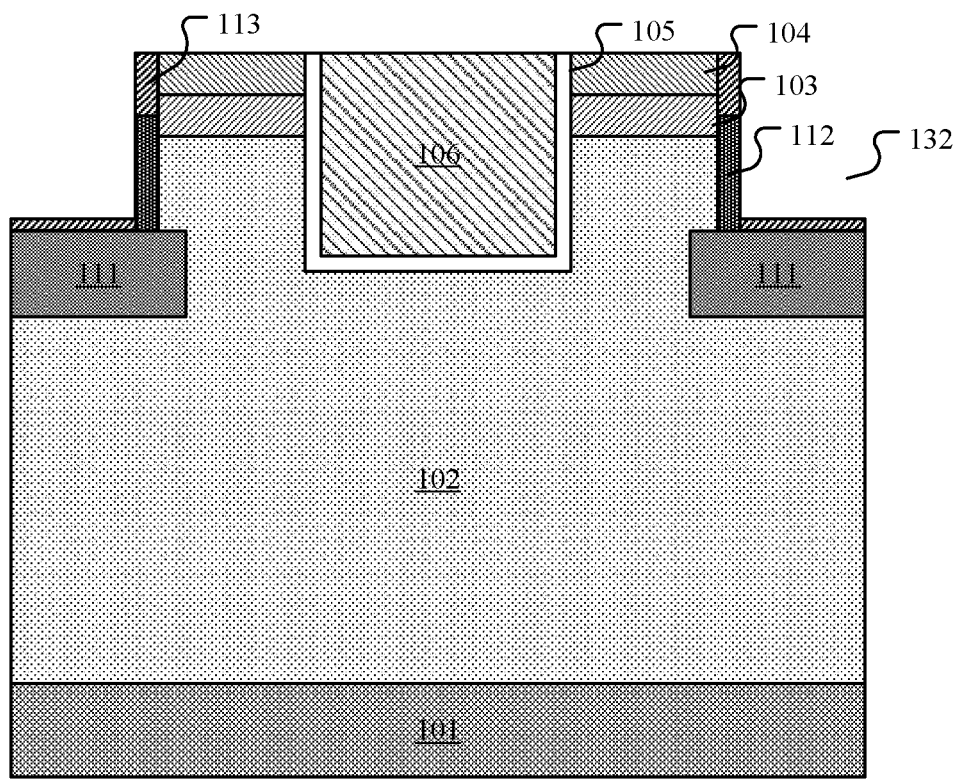

Referring to FIG. 4f, a contact layer 113 is formed at the upper part of the side wall of the second trench 132, and a contact layer 122 is formed at the bottom of the second trench 132.

In this step, a conformal metal layer is formed on the side wall and the bottom of the second trench 132 by performing chemical vapor deposition or sputtering. At the upper part of the side wall of the second trench 132, the metal layer covers exposed surfaces of the source region 104 and the well region 103, and at the bottom of the second trench 132, the metal layer covers an exposed surface of the drift region 102. Further, by performing a silicidation process, for example, heat treatment, the metal layer reacts with silicon in the source region 104, the well region 103 and the drift region 102 to form silicide. Further, an unreacted metal material is selectively removed relative to the Schottky metal and the silicide by performing selective wet etching, so that the silicide which remains at the upper part of the side wall of the second trench 132 forms the contact layer 113, and the silicide which remains at the bottom of the second trench 132 forms the contact layer 122. For example, the Schottky metal is made of titanium, the contact layers 113 and 122 are made of nickel silicide, and the metal layers used to form the contact layers 113 and 122 are made of nickel. Therefore, the selective removal can be performed using the etching rates of different materials in the etching process.

Figure 4G:
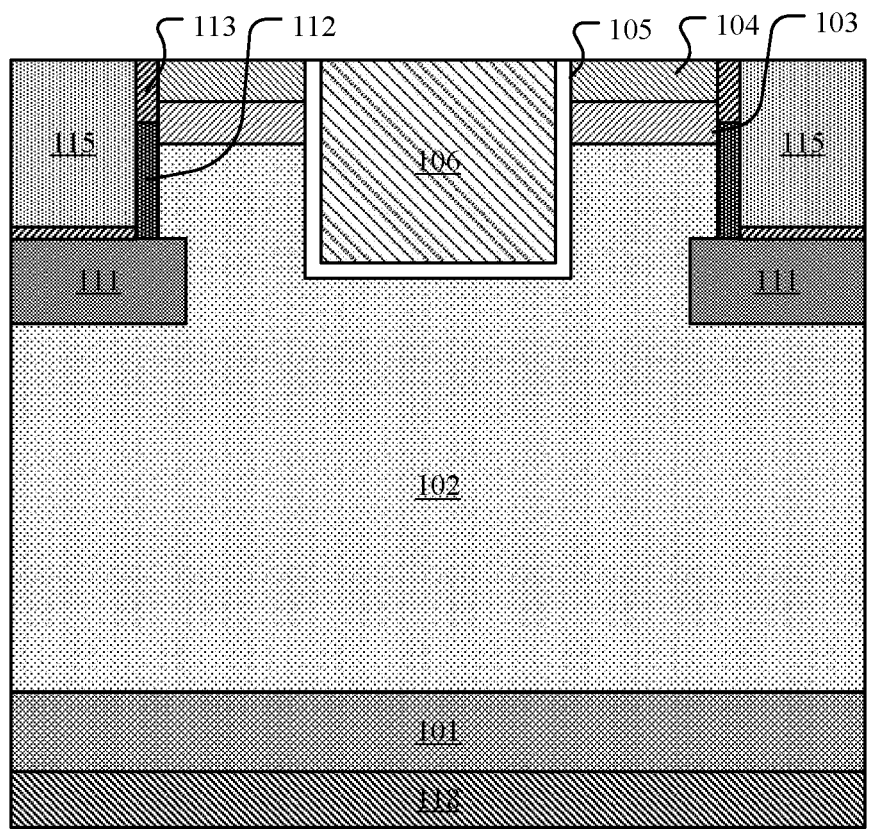

Referring to FIG. 4g, the conductive material is filled inside the second trench 132 to form the conductive channel 115.

The conductive channel 115 filled in the second trench is connected to the doped region 121 via the contact layer 122, connected to the source region 103 via the contact layer 113, and directly connected to the anode metal 112, respectively. The conductive channel 115 is composed of, for example, aluminum, copper, or an alloy thereof.

Further, a drain electrode 118 is formed on the surface, opposite to the source region, of the semiconductor substrate 101. Although not shown, the trench-type MOSFET may further comprise an interlayer dielectric layer and a source electrode located on the interlayer dielectric layer, and the source electrode is connected to the conductive channel 115 via a conductive channel in the interlayer dielectric layer, so that electrical connection between the source region 104 of the MOSFET and the anode metal 112 of the Schottky barrier diode is realized.

The embodiments in accordance with the present disclosure, as described above, are not described in detail, and are not intended to limit the present invention to be only the described particular embodiments. Obviously, many modifications and variations are possible in light of the above. These embodiments have been chosen and described in detail by the specification to explain the principles and embodiments of the present disclosure so that those skilled in the art can make good use of the present disclosure and the modified use based on the present disclosure. The invention is to be limited only by the scope of the appended claims and the appended claims and equivalents thereof.

What is claimed is:

1. A trench-type power device, comprising:
   a semiconductor substrate;
   a drift region on the semiconductor substrate;
   a first trench and a second trench located in the drift region;
   a gate stack located in the first trench; and
   Schottky metal located on a side wall of the second trench,
   wherein the Schottky metal and the drift region form a Schottky barrier diode,
   wherein the trench-type power device further comprises:
   a conductive channel, which is formed by filling a conductive material in the second trench and is positionally separated from the drift region by the Schottky metal, which is different from the conductive material;
   a doped region located below a bottom of the second trench, wherein a dopant type of the doped region is opposite to that of the drift region; and
   a second contact layer located on a bottom surface of the second trench.

2. The trench-type power device according to claim 1, further comprising:
   a well region located in the drift region; and
   a source region located in the well region,
   wherein the first trench and the second trench respectively penetrate through the source region and the well region and extend to a predetermined depth in the drift region.

3. The trench-type power device according to claim 2, wherein a dopant type of the semiconductor substrate, the drift region and the source region is N-type, a dopant type of the well region is P-type, and the semiconductor substrate serves as a drain region of a power transistor.

4. The trench-type power device according to claim 2, wherein the Schottky metal is located at a lower part of the side wall of the second trench and is in contact with the drift region, and a top end of the Schottky metal is located between the source region and the drift region.

5. The trench-type power device according to claim 4, further comprising:
a first contact layer located at an upper part of the side wall of the second trench and being in contact with the source region.

6. The trench-type power device according to claim 5, wherein the first contact layer and the second contact layer are made of metal silicide.

7. The trench-type power device according to claim 2, wherein:
an electrical connection path between the source region and the Schottky metal is provided via the conductive channel.

8. The trench-type power device according to claim 1, wherein the conductive material has a conductivity higher than that of the Schottky metal.

9. A manufacturing method of a trench-type power device, comprising:
forming a drift region on a semiconductor substrate;
forming a first trench and a second trench in the drift region;
forming a gate stack in the first trench;
forming Schottky metal on a side wall of the second trench;
forming a doped region located below a bottom of the second trench, wherein a dopant type of the doped region is opposite to that of the drift region;
forming a second contact layer located on a bottom surface of the second trench; and
filling a conductive material in the second trench to form a conductive channel,
wherein the Schottky metal and the drift region form a Schottky barrier diode,
wherein the conductive channel is positionally separated from the drift region by the Schottky metal, which is different from the conductive material.

10. The manufacturing method according to claim 9, further comprising:
forming a well region in the drift region; and
forming a source region in the well region,
wherein the first trench and the second trench respectively penetrate through the source region and the well region and extend to a predetermined depth in the drift region.

11. The manufacturing method according to claim 10, wherein a dopant type of the semiconductor substrate, the drift region and the source region is N-type, a dopant type of the well region is P-type, and the semiconductor substrate serves as a drain region of a power transistor.

12. The manufacturing method according to claim 10, wherein the step of forming the Schottky metal comprises:
forming a conformal first metal layer in the second trench; and
removing a portion, which is located at an upper part of the side wall of the second trench, of the first metal layer, and a portion, which is located at a bottom of the second trench, of the first metal layer, by performing anisotropic etching,
wherein a portion, which remains at a lower part of the side wall of the second trench, of the first metal layer forms the Schottky metal.

13. The manufacturing method according to claim 12, wherein in the step of forming the Schottky metal, a top end of the Schottky metal is located between the source region and the drift region by controlling etching time of the anisotropic etching.

14. The manufacturing method according to claim 12, wherein after the step of forming the Schottky metal, the manufacturing method further comprises:
forming a conformal second metal layer in the second trench;
generating silicide by reaction of a portion of the second metal layer, by performing a silicidation process; and
removing unreacted metal of the second metal layer relative to the Schottky metal and the silicide, by performing a selective etching process,
wherein a portion, which is located at the upper part of the side wall of the second trench, of the silicide, forms a first contact layer, and a portion, which is located at the bottom of the side wall of the second trench, of the silicide forms a second contact layer.

15. The manufacturing method according to claim 12, wherein an electrical connection path between the source region and the Schottky metal is provided by the conductive channel.

16. The manufacturing method according to claim 10, further comprising:
forming a P-type doped region below the bottom of the second trench by performing ion implantation via the second trench.

17. The manufacturing method according to claim 9, wherein the first contact layer and the second contact layer are made of metal silicide.

* * * * *